United States Patent
Yu

(10) Patent No.: US 6,466,423 B1
(45) Date of Patent: Oct. 15, 2002

(54) ELECTROSTATIC DISCHARGE PROTECTION DEVICE FOR MIXED VOLTAGE APPLICATION

(75) Inventor: Ta-Lee Yu, Hsinchu Hsien (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/478,740

(22) Filed: Jan. 6, 2000

(51) Int. Cl.[7] .................................................. H02H 9/00
(52) U.S. Cl. ........................ 361/56; 361/111; 257/355; 257/360
(58) Field of Search ............................ 361/56, 111, 86; 257/355–360, 402–403

(56) References Cited

U.S. PATENT DOCUMENTS

| | | | | |
|---|---|---|---|---|
| 5,930,094 A | * | 7/1999 | Amerasekera et al. | 361/56 |
| 5,945,713 A | * | 8/1999 | Voldman | 257/355 |
| 6,008,080 A | * | 12/1999 | Chuang et al. | 438/200 |
| 6,147,538 A | * | 1/2000 | Andresen et al. | 327/309 |
| 6,078,487 A | * | 6/2000 | Partovi et al. | 361/56 |
| 6,091,594 A | * | 7/2000 | Williamson et al. | 361/111 |
| 6,097,071 A | * | 8/2000 | Krakauer | 257/395 |
| 6,104,589 A | * | 8/2000 | Williamson | 361/111 |
| 6,118,640 A | * | 9/2000 | Kwong | 361/56 |
| 6,249,410 B1 | * | 11/2000 | Ker et al. | 361/56 |
| 6,157,530 A | * | 12/2000 | Pequignot et al. | 361/111 |

OTHER PUBLICATIONS

Anderson et al. "ESD Protection for Mixed–Voltage I/O Using NMOS Transistors Stacked in a Cascode configuration" in EOS/ESD Symposium 98–54; pp. 54–62.

* cited by examiner

*Primary Examiner*—Kim Huynh
(74) *Attorney, Agent, or Firm*—Baker Botts LLP

(57) ABSTRACT

A novel electrostatic discharge (ESD) protection device used for mixed voltage application is disclosed. A primary ESD device and a MOS transistor stack are respectively coupled to the input/output pad. The MOS transistor stack is formed in a cascode configuration comprising a first MOS transistor and a second MOS transistor form in different active areas. The drain region of the first MOS transistor is coupled to the input/output pad and the gate region is coupled to a low power supply. The second drain region of the second MOS transistor is coupled to the source region of the first MOS transistor, while the gate region and the source region grounded. The primary ESD device is selected with a junction breakdown voltage no more than the lowest junction breakdown voltage of the MOS transistor stack, so that the primary ESD device enters snapback prior to the MOS transistor stack.

12 Claims, 6 Drawing Sheets

ELECTROSTATIC DISCHARGE PROTECTION DEVICE FOR MIXED VOLTAGE APPLICATION

FIELD OF THE INVENTION

The present invention relates to an electrostatic discharge (ESD) protection circuit for protecting an integrated circuit from damaging by electrostatic discharge, and more especially, to an ESD protection circuit using for mixed voltage application.

BACKGROUND OF THE INVENTION

Electrostatic discharge (ESD) phenomena, which normally occur on integrated circuits (ICs) when touched by charged human body or machines, have a grown importance in electric and semiconductor industry. Due to the extreme high-energy electrical pulse caused, the electrostatic discharges could damage the integrated circuit badly. As the semiconductor technologies tend to reducing device dimension and increasing circuit integration, the potentially destructive nature of ESD became more and more apparent. To prevent the ICs form failure by unexpected damage, the ESD phenomena should be suppressed, and protection circuits are often employed against ESD in addition to anti-static coatings to protect the main circuit elements on IC chips.

In general, the ESD protection circuits for an IC chip are coupling to the contact ports, which typically refer to as pins or inputs/output pads, of the chip needed for protection. An ESD protection circuit forms a bypass of the main circuit and constructed with a trigger voltage at which a key junction enters avalanche breakdown and the bypass of protection circuit shorts to allow a great amount of current passing through and shunted to electrical ground. After the ESD protection circuit is triggered, a low impedance mode called snap-back occurs so that the bypassed current can flow through the protection circuit under a holding voltage that is much lower than the trigger voltage. The power dissipation is thus lessened and the main circuit is prevented from experience of ESD current.

An important conventional ESD protection circuit is MOS transistor. Under ESD stress condition, a MOS transistor is desired to behave as a bipolar transistor and act as a switch. FIG. 1A shows a cross-sectional view of a typical NMOS transistor used for ESD protection circuit including source region 20 and drain region 30 in the substrate 10, and gate 40 and gate oxide 50 on the substrate. FIG. 1B shows the I-V curve of above NMOS transistor with gate 40, source 20, and substrate 10 grounded. As the drain voltage is raised positive with respect to the substrate at a normal operation mode, no current flows through the transistor. It's because the junction 35 between the N-type doped drain 30 and P-type substrate 10 is reverse biased. The transistor is now considered to be "off". When the drain bias is raised positively beyond a breakdown voltage denoted as Vb in FIG. 1B, the junction 35 enters avalanche breakdown and a large number of electron-hole pairs are generated. As the current increased, a forward bias is contributed to the junction 25 between the P-type substrate 10 and the N-type source 20, and electrons are emitted from the source 20 into the substrate. This results in constructive feedback and allows a great current passes through the transistor. The source 20 and drain 30 act as bipolar emitter and collector respectively. The NMOS switch is now "on" at a trigger voltage denoted as Vt in FIG. 1B. A snapback effect is then occurs. The drain voltage is decreases and a negative resistance region is observed due to the availability of more carriers for multiplication until a holding level, which is denoted as Vh in FIG. 1B, is reached. Thereafter the I-V curve shows a positive resistance. In such a mechanism described above, the ESD current can be bypassed through the ESD protection device at the lower holding voltage when the instant voltage exceeds the trigger voltage. The components of the main circuit can be prevented from damage.

Above conventional NMOS transistor devices used for ESD protection encounter a problem about the mixed voltage application. As known in the art, integrated circuits, as well as computer systems were designed historically to operate under five-volt power supply. As the electric and semiconductor fabrication technology progresses, and the application market develops, lower power consumption and higher device performance are required. Lower voltage standards were then introduced. A 3.3-volt system is employed.

The new lower voltage standard were not immediately fully adopted for all applications. Devices having new standard power supply are frequently used together with those having old standard power supply. Sometimes it is needed to make new, low-voltage devices interconnected to old, high-voltage devices. For such a mixed voltage system, it must be ensured that the circuit designed to operate at lower voltage standard would not be harmed when used in the high voltage application. However, in this case, the conventional ESD protection circuit manufactured for protecting the low-voltage main device would face a high standard voltage across the thin gate oxide of the MOS transistor. Since the transistor is employed for the low-voltage protection and generally fabricated simultaneously as the protected circuit formed, the gate oxide is not designed for withstanding the high standard voltage. The high standard voltage across the gate oxide would generate strong field, increase hot carriers, and result in degradation of oxide reliability and shortening of oxide lifetime (before oxide breakdown). To do with such situation, a stack structure of NMOS transistor is developed.

Warren R. Anderson and David B. Krakauer propose a stacked structure of two NMOS transistor in a cascode configuration for mixed voltage application. In their paper "ESD Protection for Mixed-Voltage I/O Using NMOS Transistors Stacked in a Cascode Configuration" in EOS/ESD SYMPOSIUM 98, p. 54–62, the mechanism is described. FIGS. 2A and 2B show a configuration of an NMOS transistor stack. In this configuration, the two transistors 210 and 230 are merged into the same active area and share a same doped region 220 as the source of the first transistor 210 and the drain of the second transistor 230. The drain 212 and gate 214 of the first transistor 210 are respectively connected to the I/O pad and the low supply voltage (Vdd). The source 232 and gate 234 of the second transistor 230 are ground. When a high supply voltage of 5 Volts appears at the pad, the voltage of the floating shared region 220 is limited to the low supply voltage minus the threshold voltage of the first transistor 210. In such voltage distribution, none of the voltage between the gate-source, gate-drain, and source-drain terminals of either transistor exceeds 3.3 volts. No dielectric and hot carrier reliability is challenged.

Warren R. Anderson and David B. Krakauer further propose a protection circuit using two sets of NMOS stack to protect the main circuit form ESD effect. As shown in FIG. 3 and in their FIG. 15, a large primary NMOS stack and a small secondary NMOS stack are coupled between the main circuit and the I/O pad with a resistor of about 100 ohms interposed. With their proposed configuration, the main circuit can be effectively protected over 2 kV ESD under human body model (HBM). However, their proposal provides NMOS stack with different configuration from the normal ones adopted in the main circuit because the normal devices in advanced semiconductor design rule are not good enough for ESD performance. Extra process for silicide block or ion implantation is necessary as they suggest.

SUMMARY OF THE INVENTION

The present invention proposes a novel electrostatic discharge (ESD) protection circuit used for mixed voltage application for protecting a mixed voltage integrated circuit against damage from electrostatic discharge. The present ESD protection circuit comprises a primary ESD device and a MOS transistor stack respectively couple to a input/output pad of the mixed voltage integrated circuit. The primary ESD device will enter a snapback mode when its terminal voltage is raised beyond a trigger voltage. The MOS transistor stack is formed in a cascode configuration comprising a first MOS transistor and a second MOS transistor form in different active areas. The first MOS transistor comprises a first gate region, a first source region and a first drain region with the first drain region coupling to the input/output pad and the first gate region coupling to a low power supply. The second MOS transistor comprises a second gate region, a second source region and a second drain region, with the second drain region coupling to the first source region, the second gate region and the second source region grounded.

The primary ESD device is selected with a junction breakdown voltage no more than the lowest junction breakdown voltage of the MOS transistor stack. Therefore the primary ESD device enters snapback prior to the MOS transistor stack.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a novel electrostatic discharge (ESD) protection device used for mixed voltage application. This ESD protection circuit utilized stacked NMOS transistors in a cascode configuration and a primary robust device to construct ESD protection circuit. In addition, the stacked NMOS transistors are formed in different active areas.

Figure 3:
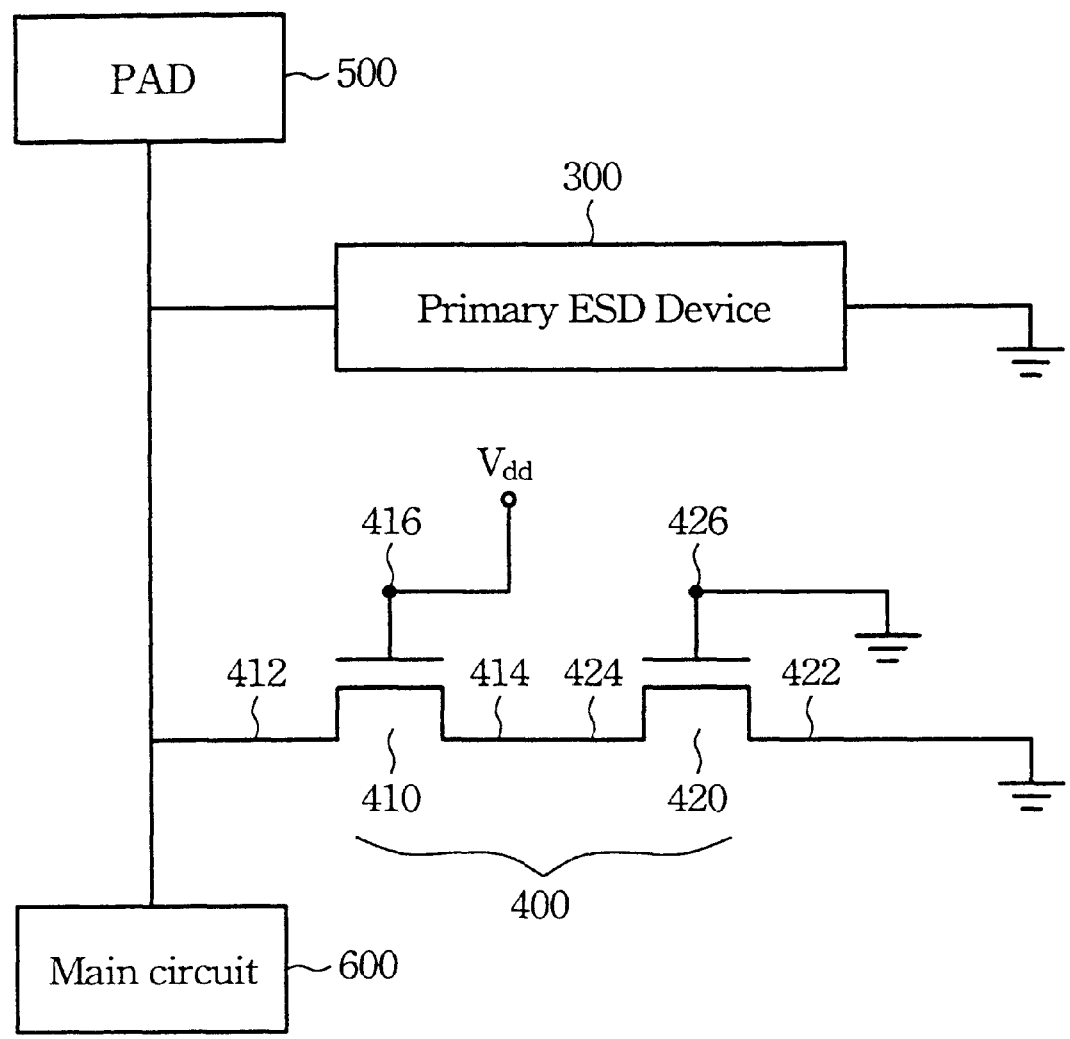
FIG. 3 is the circuit schematic diagram illustrating the mixed voltage ESD protection device according to the first embodiment of the present invention.

Referring to FIG. 3, a primary ESD device 300 and a MOS transistor stack 400 are respectively coupled to the input/output pad 500 of a main circuit 600 seeking for protection from ESD. The primary ESD device 300 can be chosen as any robust ESD device, such as lateral silicon-controlled rectifier (LSCR), that can withstand a extra high energy electrical plus of ESD. During the occurrence of an ESD event, the primary ESD device 400 is capable to limit voltage level and shunt the ESD current to electrical ground.

The MOS transistor stack 400 comprises at lease two MOS transistors in a cascode configuration. In a preferred embodiment, two MOS transistor 410 and 420 are stacked with the drain 412 of the first transistor 410 coupled to the I/O pad 500 and the source 422 of the second transistor 420 coupled to the electrical ground. The source 414 of the first transistor 410 coupled to the drain 424 of the second transistor 420. The gate 416 of the first transistor 410 is coupling to the low supply voltage Vdd, and the gate 426 of the second transistor 420 is grounded.

Figure 4A:
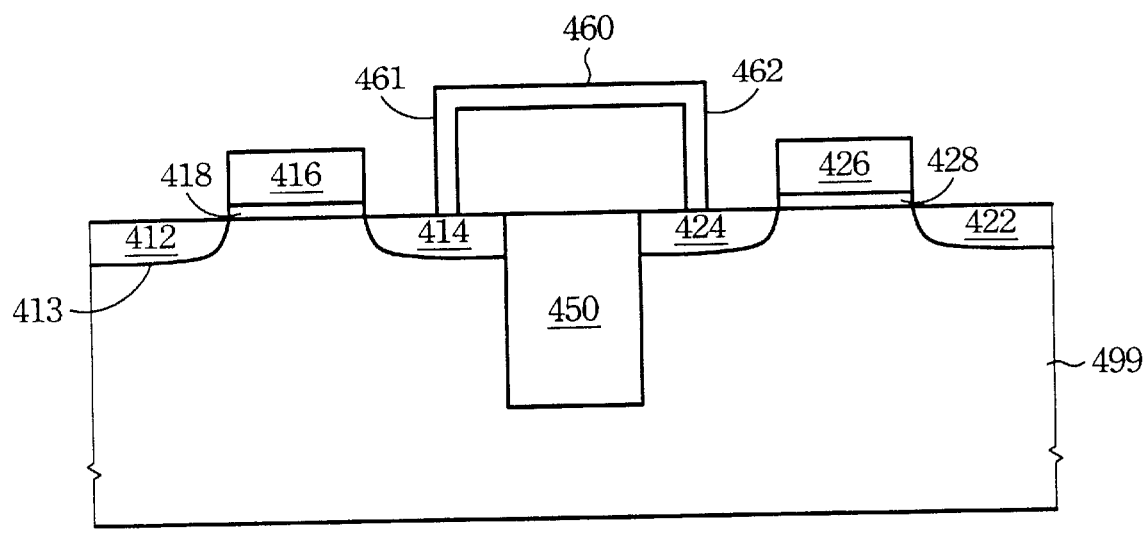
FIG. 4A is a cross-sectional view of a semiconductor wafer illustrating the stacked MOS transistor structure in a cascode configuration for mixed voltage ESD protection according to the present invention.
Figure 4B:
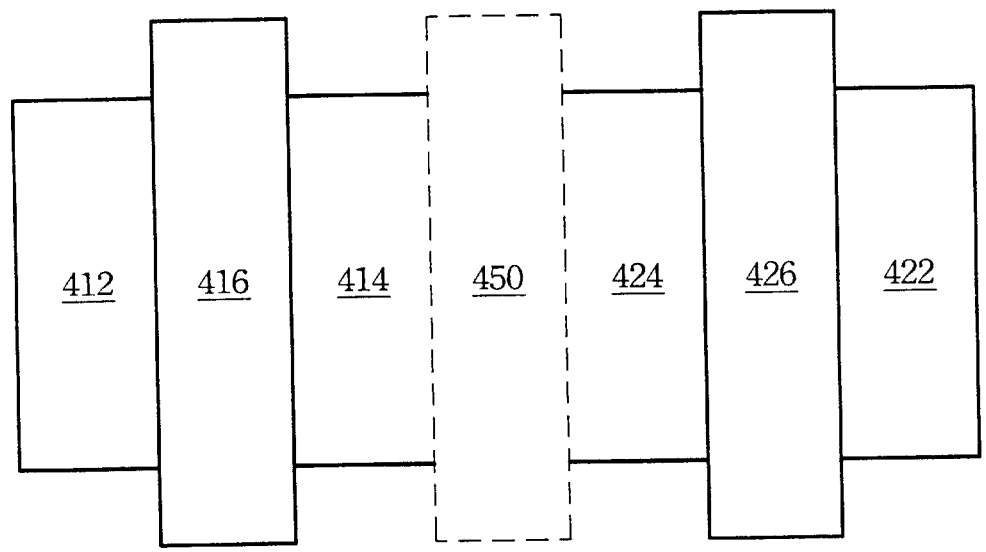
FIG. 4B is a top view of a semiconductor wafer illustrating the stacked MOS transistor structure in a cascode configuration for mixed voltage ESD protection device according to the present invention.

In this configuration, these two MOS transistor 410 and 420 are disposed in two different active area as shown in FIG. 4A with a cross-sectional view of a wafer and shown in FIG. 4B with a top view. Referring to FIG. 4A, an isolation region 450 is interposed between the two MOS transistor 410 and 420 in a semiconductor layer 499. The isolation 450 can be optionally a shallow trench isolation (STI) as shown in FIG. 4A, or alternatively a field oxide (FOX). The first transistor 410 includes drain region 412 and source region 414 formed in the semiconductor layer 499. In a preferred embodiment using NMOS transistors, the source and drain regions are formed by ion implantation with N-type impurities doped in a P-type substrate. The first transistor 410 also includes gate electrode 416 and gate oxide 418 stacked on the semiconductor layer 499 between the drain region 412 and source region 414.

The second transistor 420 includes drain region 422 and source region 424 formed in the semiconductor layer 499. The second transistor 420 is formed with the same conductive type as the first transistor 410. In the preferred embodiment described above, the source and drain regions are also formed by ion implantation with N-type impurities doped in the P-type substrate. The second transistor 420 further includes gate electrode 426 and gate oxide 428 stacked on the semiconductor layer 499 between the drain region 422 and source region 424.

The source 414 of the first transistor 410 and the drain 424 of the second transistor 420 are electrically connected, generally through a interconnecting line 460 that can be fabricated in a metallization process. The interconnecting line 460 is typically fabricated over the semiconductor layer 499 across the isolation region 450, with two plug 461 and 462 connected to the source 414 of the first transistor 410 and the drain 424 of the second transistor 420. The drain 412 of the first transistor 410 and the source 422 of the second transistor 420, as mentioned above, are respectively coupled to the I/O pad 300 of the main circuit and electrical ground. The two gate electrodes 416 and 426 respectively coupled to the low supply voltage Vdd and electrical ground have also been mentioned.

FIG. 4B displays a top view of a wafer illustrating the MOS transistor stack 400 of above embodiment. Elements labeled in FIG. 4A are identified and shown except the interconnecting line 460 and the two gate oxide films 418 and 428, wherein the latter two are lying right beneath the gate electrodes 416 and 426 respectively. The dash line encloses the isolation region 450 which separates the two active areas with the two transistors 410 and 420 formed thereon respectively.

Figure 1A:
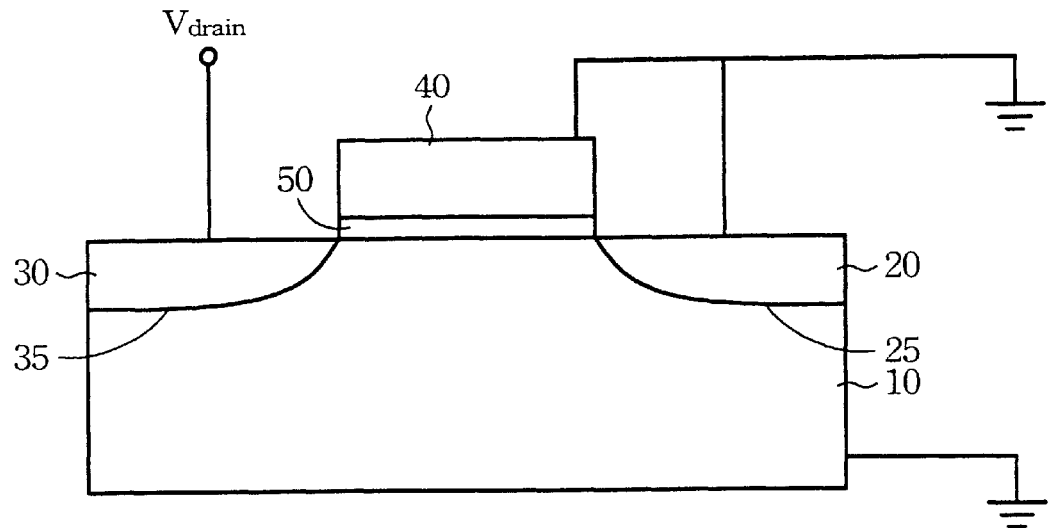
FIG. 1A is a cross-sectional view of a semiconductor wafer illustrating a MOS transistor using for ESD protection device according to the prior art.
Figure 1B:
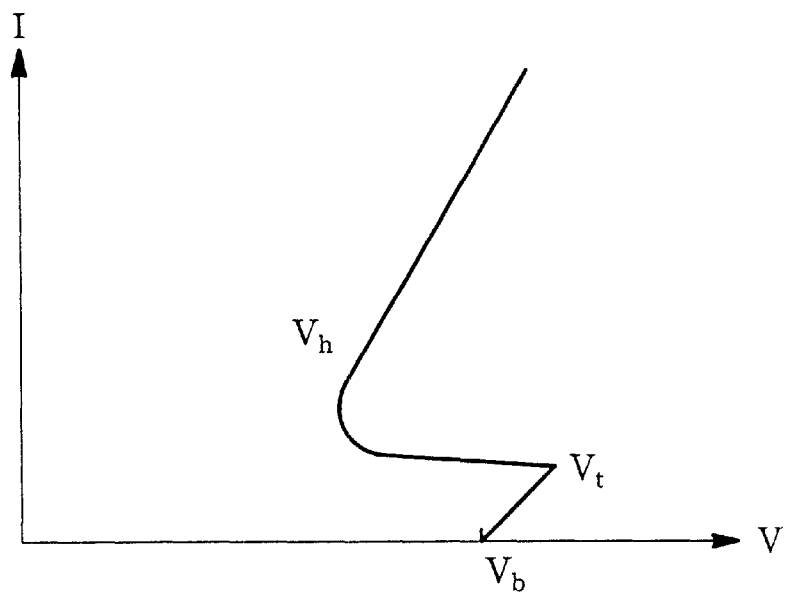
FIG. 1B is a graph illustrating the I-V character curve of the MOS ESD protection device in an ESD event according to the prior art.
Figure 2A:
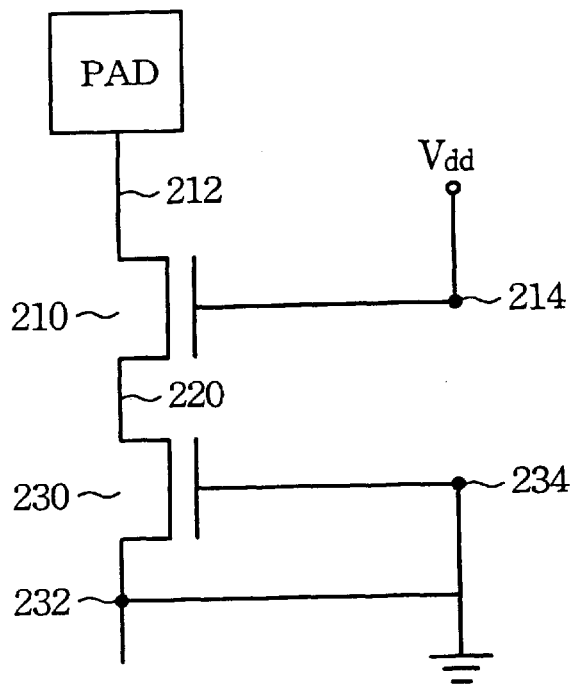
FIG. 2A is the circuit schematic diagram illustrating a stacked MOS transistor structure in a cascode configuration for a mixed voltage ESD protection device according to the prior art.
Figure 2B:
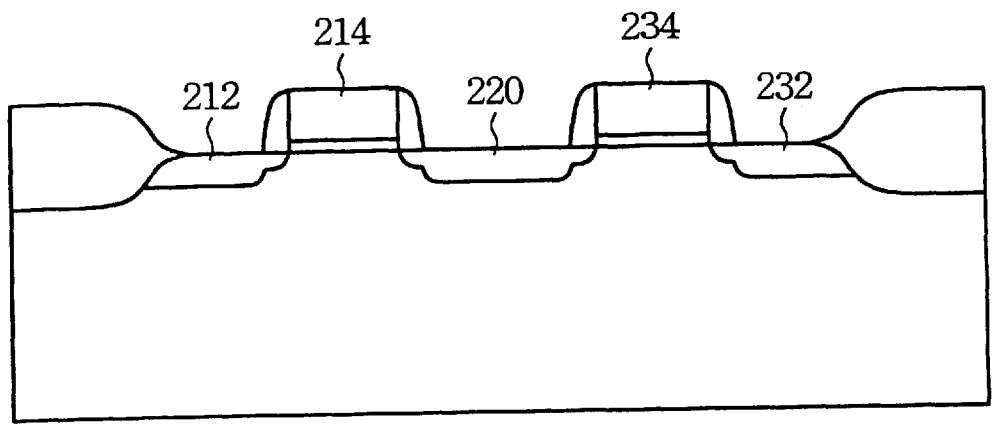
FIG. 2B is a cross-sectional view of a semiconductor wafer illustrating the stacked MOS transistor structure shown in FIG. 2A
Figure 5:
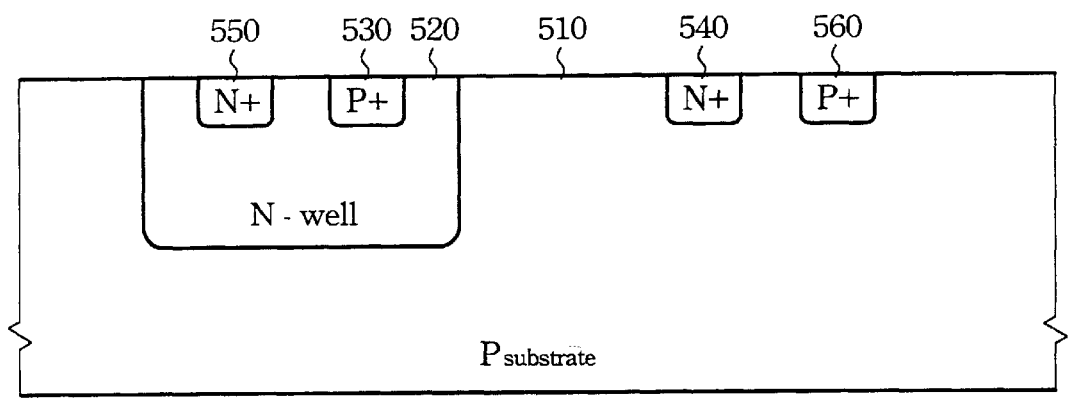
FIG. 5 is a cross-sectional view of a typical LSCR device using in the primary ESD device according to the present invention.

With above configuration that different transistors are formed in different active areas, the operation mechanism of the MOS transistor stack 400 in ESD mode is no longer the same as the prior art. During an ESD event, the extra high voltage of ESD may, in the worst case, simultaneously break down a key junction of the primary ESD device 300 and the junction 413 in the MOS transistor stack 400 between drain 412 and the semiconductor layer 499. For an embodiment using typical lateral silicon-controlled rectifier (LSCR) as the primary ESD device 300, the key junction of the LSCR is the one between the N-well and the P substrate. A typical LSCR structure is shown in FIG. 5 in cross-sectional view of a wafer. This conventional LSCR is constructed in a P-type substrate 510 with an N-type well 520 formed therein. A heavily doped P-type region 530 is formed in the N-type well 520 to serve as the anode, and a heavily doped N-type region 540 is formed in the P-type substrate 510 outside the N-type well 520 to serve as the cathode. Contact regions of the P-type substrate 510 and N-type well 520 can be optionally formed as the P-type and N-type heavily doped regions 550 and 560 respectively. In this structure, N-type region 520 is interposed between P-type regions 510 and 530 while the P-type region 510 is interposed between N-type regions 520 and 540. In an ESD event, the key junction between the N-well and the P substrate enters breakdown and then triggers the LSCR to enter snapback. That allows a great amount of current passing through the LSCR and shunted to electrical ground. The LSCR device has the same I-V diagram as shown in FIG. 1B. In other embodiment, device other than LSCR, such as low voltage SCR (LVT SCR) or floating well SCR or other ESD protection devices, can be employed for the primary ESD device 300.

Figure 6:
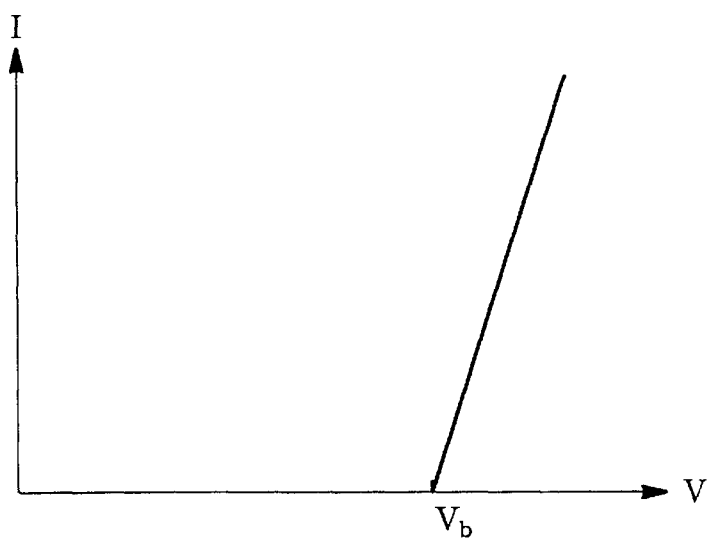
FIG. 6 is a graph illustrating the I-V character curve of the stack MOS transistor structure in an ESD event according to the present invention.

However, the MOS transistor stack 400 formed in separated active areas has only parasitic diode effect and acts without snapback. Its I-V curve is displayed in FIG. 6. As shown, the current in the MOS transistor stack 400 increases as its voltage increases, and no negative resistance region is observed. Therefore, after the primary ESD device enter snapback, the voltage across the electrical ground and the I/O pad 500 decreases to the lower holding level Vh. The MOS transistor stack 400 is thus no longer at the breakdown mode because the terminal voltage is reduced below its breakdown level. The ESD current then flows through the primary ESD device 300 but not the MOS transistor stack 400. The MOS transistor stack 400 is thus substantially protected by the primary ESD device 300 form most ESD impact.

Figure 7:
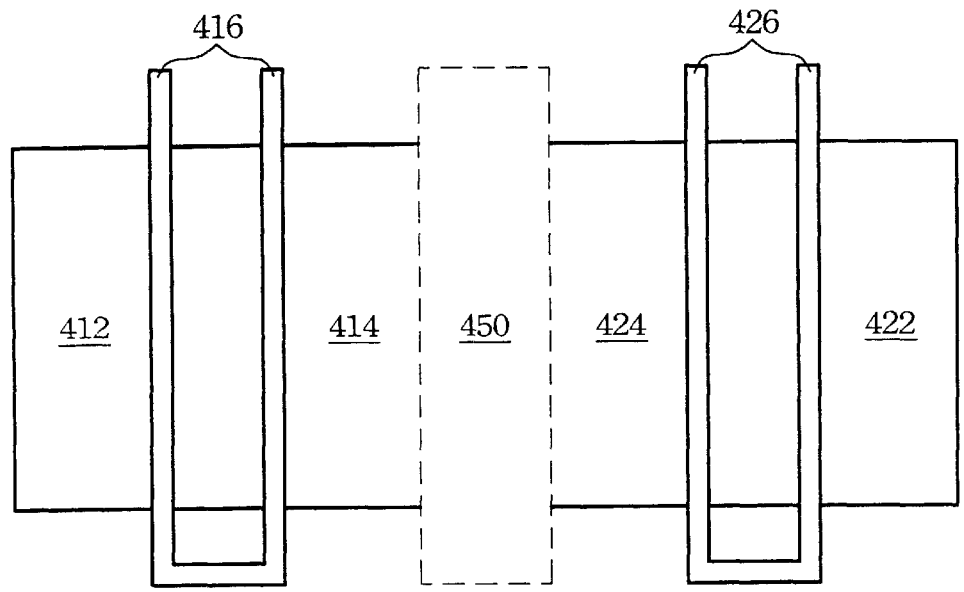
FIG. 7 is a top view of a semiconductor wafer illustrating the stacked MOS transistor structure with multi-fingered gate structures according to the present invention.
Figure 8:
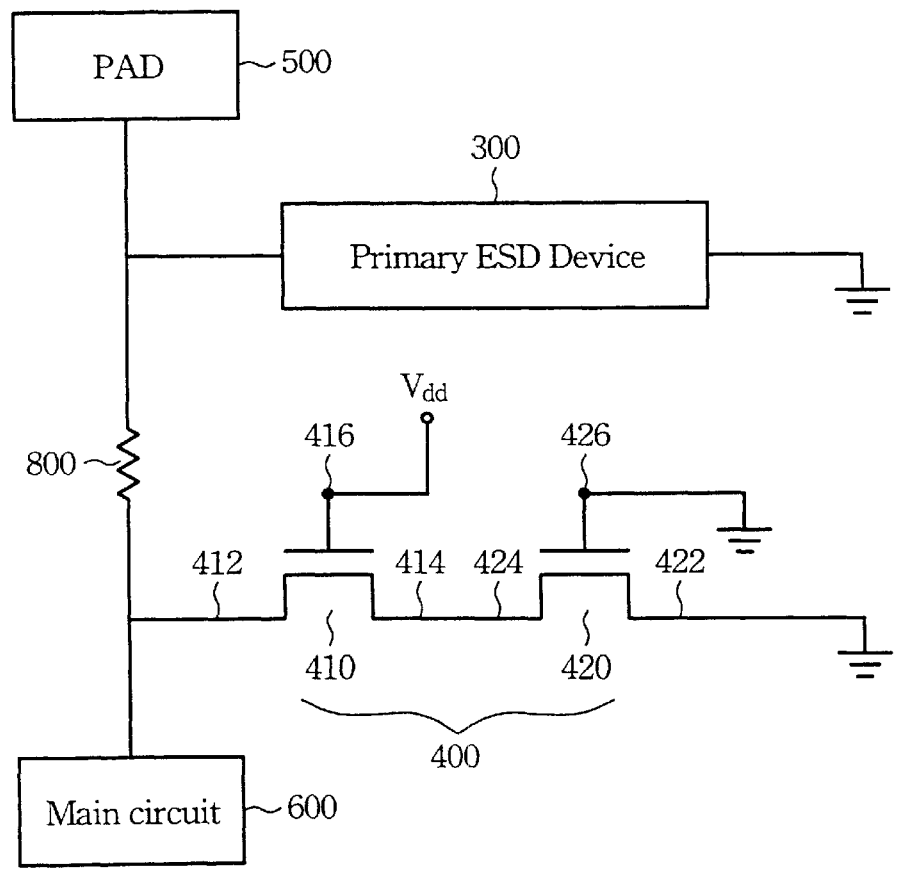
FIG. 8 is the circuit schematic diagram illustrating the mixed voltage ESD protection device according to the second embodiment of the present invention.

In a second embodiment, the MOS transistor stack 400 can be laid out with a top view of a wafer illustrated in FIG. 7. In this embodiment, a multi-fingered MOS transistor stack 400 is employed. The multi-fingered gate structures are adopted instead of the ones illustrate in FIG. 4B. In a further embodiment, a resistor 800 can optionally be interposed between the I/O pad 500 and the NMOS transistor stack 400. In this embodiment, the primary ESD device 300 is connected to the I/O pad with a contact between the I/O pad 500 and the resistor 800.

In the present design, the primary ESD device 300 should be selected with capability to enter snapback after a junction breakdown when its terminal voltage is raised beyond its trigger voltage. The junction breakdown voltage of the primary ESD. device 300 should be less than, at most equal to, the lowest junction breakdown voltage of the MOS transistor stack 400. In such an arrangement, the MOS transistor stack 400 will not experience a long-time breakdown and will be prevented from great ESD current passing through before the primary ESD device 300 enters snapback during an ESD event. The primary ESD device 300 takes most of the ESD impact and the MOS transistor stack 400 shares only a very little part. Therefore, the MOS transistor stack 400 can be fabricated with the minimum design rule without consideration about the robustness against the ESD effect. The MOS transistor stack as well as the ESD cell can be formed as small as possible without tradeoff with ESD performance.

Furthermore, above benefit can be achieved without any extra manufacture process. All the fabrication of the present ESD protection device can be accomplished simultaneously as the protected main circuit is made. Any element in the present ESD protection device adopts the same design rule as the main circuit. No extra processes, such as higher dosage ion implantation for higher concentration doped regions, or silicide blocked technology suggested by Warren R. Anderson and David B. Krakauer, is necessary. The ESD protection device can be implemented effectively and economically for the mixed voltage application.

As is understood by a person who is skilled in the art, the foregoing preferred embodiments of the present invention are illustrated of the present invention rather than limiting of the present invention. It is intended to cover various modifications and similar arrangements included within the spirit and scope of the appended claims, such as using more than two MOS transistors in the cascode configuration, or using PMOS transistor for the transistor stack. The scope of such modifications should be accorded the broadest interpretation so as to encompass all such modifications and similar structure.

What is claimed is:

1. An electrostatic discharge protection circuit for protecting a mixed voltage integrated circuit against damage from electrostatic discharge, said protection device comprising:

a primary ESD device coupling to a input/output pad of said mixed voltage integrated circuit, said primary ESD device will enter a snapback mode when its terminal voltage is raised beyond a trigger voltage;

a MOS transistor stack formed in a cascode configuration coupling to said input/output pad of said mixed voltage integrated circuit, said MOS transistor stack comprising a first MOS transistor and a second MOS transistor formed in different active areas, said first MOS transistor comprising a first gate region, a first source region and a first drain region, said first drain region coupling to said input/output pad, said first gate region coupling to a low power supply, said second MOS transistor comprising a second gate region, a second source region and a second drain region, said second drain region coupling to said first source region, said second gate region and said second source region grounded; and an isolation region posited between said first MOS and said second MOS.

2. The protection circuit of claim 1, wherein said primary ESD device is selected with a junction breakdown voltage no more than the lowest junction breakdown voltage of said MOS transistor stack.

3. The protection circuit of claim 1, wherein said primary ESD device and said MOS transistor stack are formed such that said primary ESD device enters snapback prior to said MOS transistor stack when applied voltage is continuously raised.

4. The protection circuit of claim 1, wherein said primary ESD protection device comprises a silicon-controlled rectifier device.

5. The protection circuit of claim 4, wherein said semiconductor-controlled rectifier is formed in a semiconductor layer of first conductive type and comprising:

a well region of second conductive type formed in said semiconductor layer;

a first region of first conductive type formed in said well region;

a second region of second conductive type formed in said semiconductor layer and spaced from said well region.

6. The protection circuit of claim 5, wherein said semiconductor-controlled rectifier further comprising a substrate contact region of first conductive type formed in said semiconductor layer.

7. The protection circuit of claim 5, wherein said semiconductor-controlled rectifier further comprising a well contact region of second conductive type formed in said well region.

8. The protection circuit of claim 1, wherein said first source region of said first MOS transistor is separated from said second drain region of said second MOS transistor by a field isolation region selected from the group consisting of trench isolation region and field oxide (FOX) region.

9. The protection circuit of claim 8, wherein said first source region of said first MOS transistor and said second drain region of said second MOS transistor are connected with a interconnecting conductive line.

10. The protection circuit of claim 1 further comprising a resistor interposed between said MOS transistor stack and said input/output pad of said mixed voltage integrated circuit.

11. The protection circuit of claim 10, wherein said primary ESD device is coupled to said input/output pad of said mixed voltage integrated circuit with a contact located between said resistor and said input/output pad of said mixed voltage integrated circuit.

12. The protection circuit of claim 1, wherein said first gate region of said first MOS transistor and said second gate region of said second MOS transistor are constructed with multi-fingered gate structures.

* * * * *